(12) United States Patent
Sanoner et al.

(10) Patent No.: US 7,495,455 B2
(45) Date of Patent: Feb. 24, 2009

(54) STUD SENSING DEVICE

(75) Inventors: Hughes Sanoner, Discovery Bay (HK); Desmond Wai Nang Tse, New Territories (HK); Lawrence Chi Hang Chan, New Territories (HK)

(73) Assignee: Solar Wide Industrial Limited, Tsuen Wan, New Territories (HK)

( * ) Notice: Subject to any disclaimer, the term of this patent is extended or adjusted under 35 U.S.C. 154(b) by 0 days.

(21) Appl. No.: 11/692,391

(22) Filed: Mar. 28, 2007

(65) Prior Publication Data

US 2007/0210785 A1 Sep. 13, 2007

Related U.S. Application Data

(63) Continuation-in-part of application No. 10/986,439, filed on Nov. 12, 2004, now Pat. No. 7,256,587, which is a continuation-in-part of application No. 10/462,832, filed on Jun. 17, 2003, now Pat. No. 6,894,508.

(60) Provisional application No. 60/519,378, filed on Nov. 12, 2003, provisional application No. 60/391,964, filed on Jun. 28, 2002.

(51) Int. Cl.
*G01R 27/26* (2006.01)
*G01R 19/00* (2006.01)

(52) U.S. Cl. .......................... 324/662; 324/67
(58) Field of Classification Search ............ 324/662, 324/67
See application file for complete search history.

(56) References Cited

U.S. PATENT DOCUMENTS

| | | | |
|---|---|---|---|
| 3,226,496 A | 12/1965 | Seabury, Jr. | |
| 4,464,622 A | 8/1984 | Franklin | |
| 4,859,931 A * | 8/1989 | Yamashita et al. | ............ 324/67 |
| 5,296,807 A | 3/1994 | Kousek et al. | |
| 5,352,974 A | 10/1994 | Heger | |
| 5,512,834 A | 4/1996 | McEwan | |
| 5,619,128 A | 4/1997 | Heger | |
| 6,023,159 A * | 2/2000 | Heger | ............ 324/67 |
| 6,215,293 B1 | 4/2001 | Yim | |
| 6,249,113 B1 | 6/2001 | Krantz et al. | |
| 6,259,241 B1 | 7/2001 | Krantz | |
| 6,456,053 B1 | 9/2002 | Rowley | |
| 6,894,508 B2 | 5/2005 | Sanoner et al. | |
| 6,989,662 B2 | 1/2006 | Heger et al. | |
| 7,116,091 B2 | 10/2006 | Miller | |
| 7,148,703 B2 | 12/2006 | Miller | |
| 2005/0138886 A1 | 6/2005 | Sanoner et al. | |

* cited by examiner

*Primary Examiner*—Vincent Q Nguyen
*Assistant Examiner*—Amy He
(74) *Attorney, Agent, or Firm*—Leydig, Voit & Mayer, Ltd.

(57) ABSTRACT

A multiple sensitivity stud sensing device for determining a location of objects behind a wall lining has a housing with a surface for moving over the wall lining. Within the housing are a capacitive sensor with first and second capacitances located adjacent the surface and control circuitry. The control circuitry includes a detecting circuit connected to the sensor for providing a detection signal related to an imbalance between the first and second capacitances, and a processor for receiving the detection signals and providing a display signal. A display is located on the housing for indicating location of an object behind the wall lining. The processor compares a detection signal to stored predetermined threshold values of detection signals associated with different wall lining thicknesses and displays a thickness value to the user.

17 Claims, 13 Drawing Sheets

STUD SENSING DEVICE

BACKGROUND OF THE INVENTION

1. Field of the Invention

The invention relates to a stud sensing device for detecting objects behind wall linings.

2. Description of Prior Art

Stud detectors are well known and rely on detecting changes in dielectric constant. A portable stud locating device is fully described in U.S. Pat. No. 4,464,622. But the device ignores the effect of wall lining thickness on the accuracy of locating stud edges, and provides no compensation for it.

U.S. Pat. No. 5,352,974 discloses a stud sensor of dual sensitivity. However, experiments show that dual sensitivity is not adequate to accommodate operation of a stud sensor upon walls, which are practically available, of varied thickness ranging from ½ to 2 inches.

U.S. Pat. No. 6,215,293 discloses a stud sensing device comprising a routine of searching for studs for 5 seconds after self-calibration of the device. If no (wood) studs are detected during the 5-second period, the wood stud detection circuit is disabled. This functions as a means to determine the presence of studs behind walls. However, it does not provide a compensating means to eliminate the effect of wall thickness on the accuracy of locating studs.

As different wall thickness affects the accuracy of locating stud edges, a stud sensor with fixed or pre-assigned sensitivity may not be able to locate stud edges accurately enough.

SUMMARY OF THE INVENTION

It is an object of the invention to provide a stud sensing device for sensing studs through wall linings of different thickness. It is another object of the invention to provide a stud sensing device that operations under different ambiences with flexibility and user-defined sensitivity, as studs of different width or density and humidity could have an effect on detection accuracy. Yet another object of the invention to provide a method for determining wall lining thickness and automatically compensating for its effect on locating studs.

According to a first aspect of the invention there is provided apparatus for detecting objects behind a wall lining including an input device for allowing a user to select of multiple sensitivities for the apparatus. Preferably the input device allows the user to selects one of a plurality of sensitivities. Preferably, although not exclusively, the sensitivities are related to a wall lining thickness. Preferably the apparatus also includes a display for showing the sensitivity.

In one embodiment the input device is a slide switch. In another embodiment the input device is a push button switch.

According to a second aspect of the invention there is provided an apparatus for detecting objects behind a wall lining including an input device for allowing a user to select a sensitivity for the apparatus from within a continuous sensitivity range. In a third embodiment the input device is a continuous adjustor, such as a linear or rotary potentiometer (variable resistor) or the like.

According to a third aspect of the invention there is provided an apparatus for detecting objects behind a wall lining including an automatic sensitivity adjustment process for detecting and compensating for the effect of wall lining thickness. Preferably the process includes defining a relationship between a wall lining thickness and a detection circuit parameter. Preferably the detection circuit parameter is voltage.

According to a further aspect of the invention there is a stud sensing device for locating objects behind wall linings comprising a sensor having at least first and second generally coplanar capacitor plates having capacitances dependent on adjacent material, a detection circuit connected to the sensor providing a detection signal dependent on changes of detected capacitances, processing means for receiving said detection signal and identifying a maximum signal value, and for comparing the maximum signal value with stored predetermined threshold values associated with different object depths, and means for indicating to a user the associated object depth.

The stored predetermined threshold values associated with one of more thickness values, typically in the United States the values being ½, ⅝, ¾, 1, 1½, and 2 inches. It will be appreciated that for countries where wall linings are in metric units, the threshold values will be adjusted accordingly.

In one preferred form the stored predetermined threshold values are voltages associated with stud depths of 1 inch and 1½ inches, denoted $V_{1.0}$ and $V_{1.5}$. The processor is configured to compare the detected voltage signal maxima with said two stored values, and to indicate depth as ½ inch if detected voltage is greater than $V_{1.0}$ and $V_{1.5}$, to indicate depth as 1 inch if greater than $V_{1.5}$, but less than $V_{1.0}$ and to indicate depth as 1½ inch if less than both $V_{1.5}$ and $V_{1.0}$. The stored predetermined values are preferably obtained experimentally, being the averages of a large number of prior tests over a variety of ambient conditions (temperature and humidity being particularly relevant), and for a variety of types of wall linings. It is found that typically $V_{1.0}$ is about 3 volts and $V_{1.5}$ about 2.3 volts.

Alternatively, the processing means may be configured to utilize the detection signal voltage and compare it to a larger series of stored predetermined values, indicating the depth associated with stored signal which is closest to the detection signal voltage.

In the or each sensor there is provided said capacitor plates and associated resistors forming RC circuits of time constant dependent on the adjacent wall material, the detections signal being of magnitude dependent on change in time constants of said RC circuits.

The device may be of a type having a pair of sensors each having at least two generally coplanar capacitor plates and associated resistors forming the RC circuits detection circuits connected to each sensor, providing first and second detection signals dependent on the changes of capacitances. The larger of the first and second detection signals are utilized in the comparison with stored predetermined threshold values.

In a still further aspect of the invention there is provided a method detecting stud depth beneath a wall lining utilizing a stud sensing device with a sensor having generally coplanar first and second capacitor plates having capacitances dependent on adjacent material and a detection circuit providing a detection signal dependent on a change in capacitance, the method comprising the steps of i) moving the sensing device over the wall and repeatedly generating a detection signal, ii) identifying a detection signal maximum, iii) comparing the detection signal maximum with stored predetermined values associated with different stored depths, and iv) indicating to the user the identified stud depth.

Further aspects of the invention will become apparent from the following description and drawings, which are given by way of example only to illustrate the invention.

BRIEF DESCRIPTION OF THE DRAWINGS

Embodiments of the invention will now be described with reference to the accompanying drawings in which.

DESCRIPTION OF THE PREFERRED EXAMPLES

Figure 1:
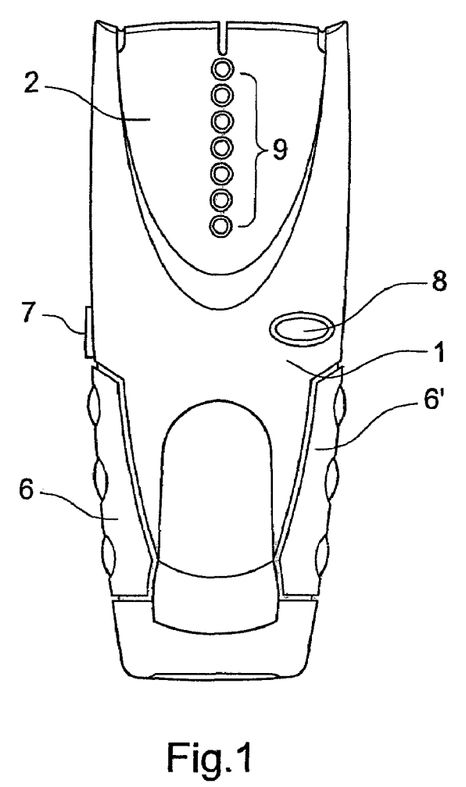
FIG. 1 illustrates a front view of a multiple sensitivity stud sensing device according to the invention.
Figure 2:
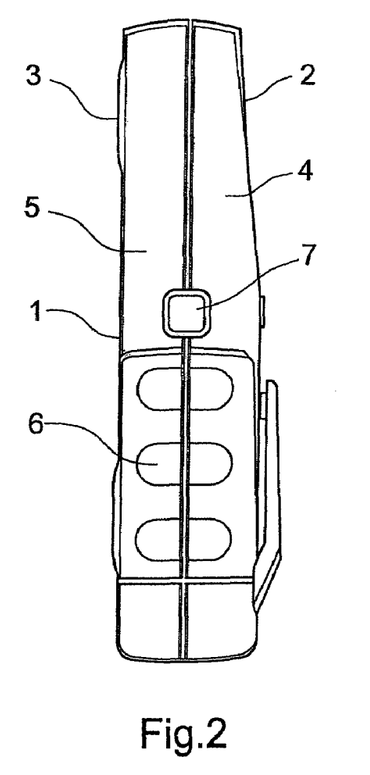
FIG. 2 illustrates a side view of the device.

In FIGS. 1 and 2 there is depicted a multiple-sensitivity stud sensor device for detecting objects behind a wall lining. The device includes a housing 1 formed from front and rear housing elements 4, 5 that clip or secure together at an equator to enclose operating circuitry. The front element 4 includes a display area 2 and the back element 5 includes a detection face 3 that is placed against a wall lining. The housing 1 also includes a grip portion 6. Proximate the grip portion 6 is an on-off push button switch 7 and a sensitivity selection push button switch 8.

On display 2, are seven indicator LEDs 9 for indicating a location of an object behind a wall lining. In operation the device is moved slowly over a wall lining. A first indicator LED 9 illuminates to indicate the presence of an object behind the wall lining. As the distance between the object and the device decreases, i.e. the device moves closer to the object, further indicator LEDs 9 illuminate progressively. All seven indicator LEDs 9 illuminate and a buzzer 26 is turned on when the device moves over a first edge of the object behind the wall lining.

Figure 3:
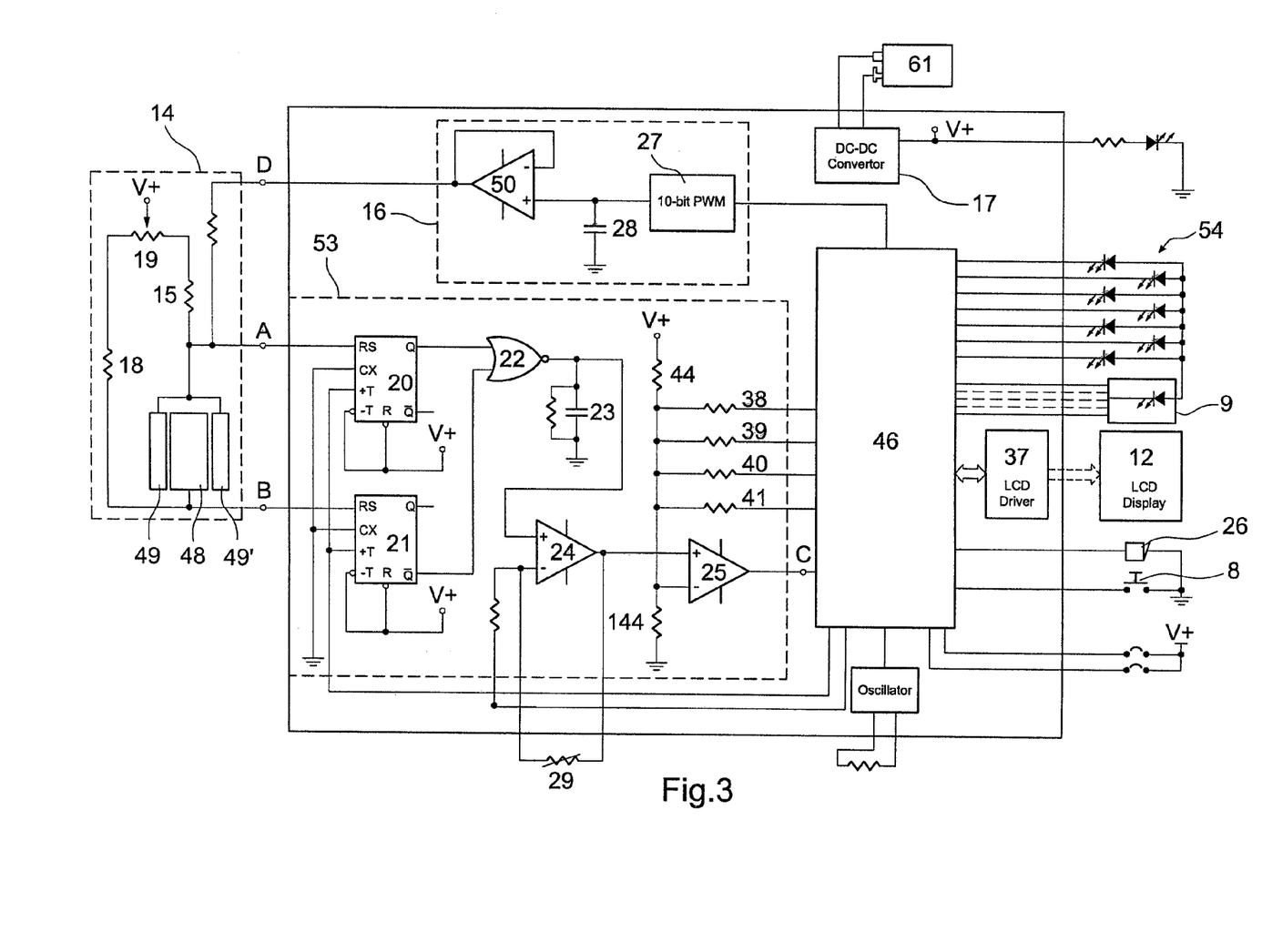
FIG. 3 is circuit diagram for the device.

FIG. 3 is a circuit diagram of the electronics of the device. The circuit includes a micro-controller 46, a detector circuit 53, sensing element 14, and a calibration circuit 16. A converter 17 provides a circuit voltage from a portable power source such as a battery 61. The detector circuit 53, sensing element 14, and a calibration circuit 16 are the same as those in applicants earlier U.S. patent application Ser. No. 10/462, 832 titled Apparatus and Method for Locating Objects Behind a Wall Lining, the contents of which is incorporated herein by reference.

The sensor element 14 comprises capacitor plates 48, 49 and 49', and resistors 15 and 18 forming two resistor-capacitor (RC) circuits connected at nodes A and B. One RC circuit comprises capacitor plate 48 and resistor 18 and the other comprises capacitor plates 49 and 49' and resistor 15. Variable resistor 19 is used to balance the RC circuits during factory calibration.

At power-up calibration circuit 16 applies a DC bias voltage to input node D of the RC circuits of sensor element 14. The calibration circuit 16 comprises a PWM module 27 and a capacitor 28 connected to the PWM module 27 output. The capacitor 28 acts as an integrator by smoothing, or averaging, the output pulses of the PWM module 27. To increase the DC bias level the duty cycle of PWM module 27 is increased. To reduce the DC bias the duty cycle of PWM module 27 is decreased. The DC bias is applied through a voltage follower 50. Because the input impedance of the voltage follower 50 is very high it isolates the sensing element 14 from the PWM module 27 and capacitor 28 avoiding a "loading" effect, which might affect the DC bias voltage level. The voltage follower 50 is not essential and the integrated output of PWM module 27 can be applied directly to the sensing element 14.

As the device is moved across the wall surface the presence of an object, such as a wall stud, behind the wall lining changes the stray capacitance of capacitor plates 48, 49 and 49' resulting in a variation of RC times at the two sensor nodes A and B. Nodes A and B are connected to respective inputs of two monostable vibrators 20, 21 of detector circuit 53. The monostable vibrators 20, 21 are triggered by the controller 46 and their respective outputs change state for a length of time determined by the time constant of the RC circuit at the respective input. The monostable vibrators 20, 21 convert the two RC time constants of the RC circuits into digital pulses of varying periods. A discussion of how the output of a monostable vibrator varies with a change in RC time constant can be found in U.S. Pat. No. 4,464,622 to Franklin beginning at column 2 line 42.

The digital output pulses of the first monostable vibrator 20 and the inverted output of second monostable vibrator 21 are fed into the inputs of a NOR gate 22. The output of the NOR gate 22 is voltage spikes that vary in height, amplitude, with the difference between the RC time constants of the two RC circuits. A capacitor 23 at the output of the NOR gate 22 integrates the voltage spikes to give a detection signal relative to the difference between the RC time constant of the two RC circuits. The detection signal is amplified by a non-inverting amplifier 24. The gain of amplifier 24 can be adjusted by variable resistor 29.

The output of the amplifier 24 is compared with a reference setpoint by a comparator 25. The reference setpoint for comparator 25 is provided by a voltage divider network comprising resistors 144, 44, 38, 39, 40, and 41. The output signal of the comparator 25 is input to the controller 46. Depending on the output level of comparator 25 the micro-controller 46 illuminates indicator LEDs 9 for each proximity stage.

The change in stray capacitance caused by an object behind the wall lining is related to the thickness of the wall lining. To account for wall thickness the sensitivity of the stud sensor is adjusted to make the detector circuit 53 more, or less, sensitive to changes in stray capacitance of the capacitor plates 48, 49 and 49'. Standard wall lining thicknesses are ½-inch, ⅝-inch ¾-inch, 1-inch, 1¼-inch, 1½-inch, and 2-inches.

Sensitivity of the device can be adjusted to either changing the gain of amplifier 24, via variable resistor 29, or by changing the reference setpoint of comparator 25. For thicker wall linings sensitivity is increased by increasing the gain of amplifier 24 or by lowering the reference setpoint for comparator 25. For thinner wall linings the sensitivity is decreased by decreasing the gain of amplifier 24 or by raising the reference setpoint for comparator 25.

In a first preferred embodiment variable resistor 29 is set at the factory. The controller 46 is provided with a database or look-up table containing comparator setpoint values for each of the standard wall lining thicknesses of ½-inch, ⅝-inch ¾-inch, 1-inch, 1¼-inch, 1½-inch, and 2-inches. At power-up the controller 46 sets a reference setpoint for comparator 25 to the value for the minimum wall thickness of ½-inch. After calibration a user can push button 8 to select a required sensitivity of the device depending on wall lining thickness. At each push of button 8 the controller sets the reference setpoint value for the next thicker wall lining. When 2-inches is reached the controller loops back to the reference setpoint value for ½-inch.

The controller sets the reference setpoint value by grounding selected ones of resistors 38, 39, 40, and 41 to change the ratio of the voltage divider network. The database or look-up table can contain information relating resistors to be grounded to reference setpoint values.

Figure 4:
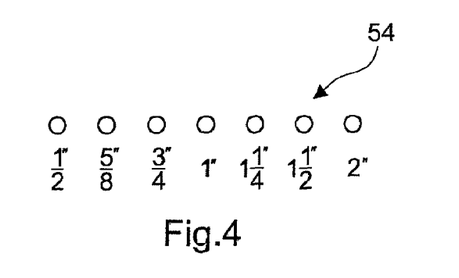
FIG. 4 illustrates an LED display for the device
Figure 5:
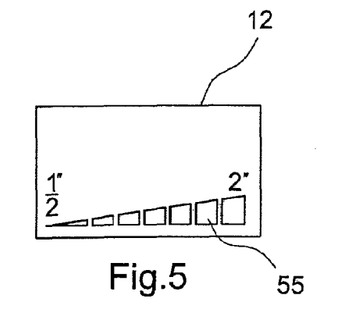
FIG. 5 illustrates an LCD display for the device.

The controller 46 has outputs for LEDs 54 and an LCD driver 37 and display 12. FIGS. 4 and 5 show two schemes for indicating on the display 2 which sensitivity setting has been selected. In the preferred embodiment of FIG. 4 a series of LEDs 54 are used. The LED corresponding to the selected sensitivity is illuminated. The alternative embodiment of FIG. 5 utilises a horizontal bar 55 on LCD display 12.

Figure 6:
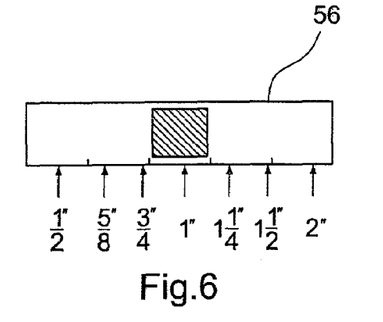
FIG. 6 is a second embodiment of the input device.

Referring to FIG. 6, in a second embodiment of the invention the push button 8 is replaced with a slide switch 56 having 7 positions corresponding to the wall lining thicknesses of ½-inch, ⅝-inch ¾-inch, 1-inch, 1¼-inch, 1½-inch, and 2-inches. The slide switch 56 is connected to controller 46 for selecting the required reference setpoint value.

Figure 7:
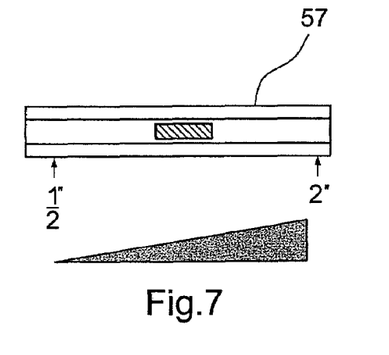
FIG. 7 is a third embodiment of the input device.
Figure 8:
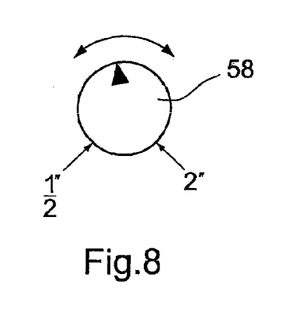
FIG. 8 is a forth embodiment of the input device.

Referring to FIGS. 7 and 8, in third and forth embodiments of the invention the push button 8 is replaced with a user adjustable continuously-variable linear potentiometer 57 or a rotary potentiometer 58 respectively. The user can select a sensitivity setting by sliding, or tuning, the potentiometer.

A potentiometer provides a continuous change in resistance, which corresponds to an infinite number of sensitivity settings. The controller is provided with a larger database or look-up table having a finer range of reference setpoint values. In combination with a greater number of voltage divider resistors it provides much finer selection of sensitivity values between the standard wall lining thicknesses. Its advantage over a fixed number of choices of sensitivity is the provision of a flexible means for user definition of the desired sensitivity for locating studs.

Alternatively, the potentiometer could replace resistor 29 allowing the user to directly adjust the gain of amplifier 24.

Figure 9:
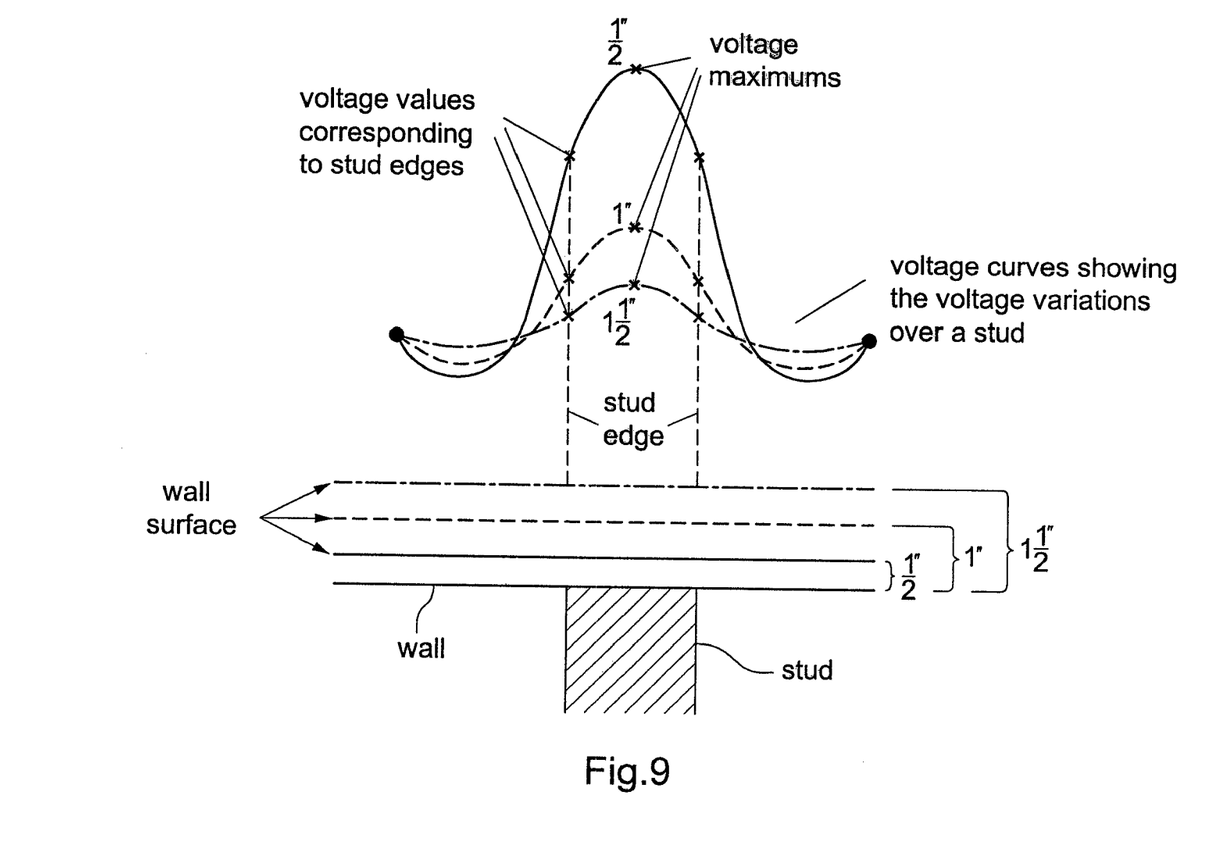
FIG. 9 illustrates a relationship between a wall lining thickness and a detection circuit parameter, such as voltage.

The relationship between maximum voltage output amplifier 24 and wall lining thickness is illustrated by FIG. 9. Different wall thickness results in a different maximum output voltage signal from the detection circuit 53. The thicker the wall lining the less the voltage maximum. If the controller 46 is provided with a database containing information about the relationship between the wall thickness, the voltage maximum and the voltage values when the device is located at stud edges, the device is capable of eliminating or greatly reducing the effect of wall thickness on the accuracy of locating stud edges.

In a fifth embodiment of the invention, the apparatus may include a process for detecting and automatically compensating for the effect of wall lining thickness on accuracy of locating studs. Firstly, the apparatus is self-calibrated on a wall. The device then goes through an auto sensitivity selection step. This step is undertaken with the comparator reference setpoint set at the value for the minimum ½-inch wall thickness. During this step the user moves the apparatus over the wall surface. The controller observes detection signal changes relating to changes in dielectric constant due to the presence of objects, e.g. studs, behind the wall lining. It does this by setting various comparator reference setpoints and observing the comparator signal output. Data linking a plurality of voltage maximums of the detection signals with comparator reference setpoint values is stored in a database or look-up table in controller 46. The controller selects and sets a new value for the comparator reference setpoint in response to the value of the maximum voltage of detection signal.

The advantage of the self-adjusting process is that it does not require the user to have prior knowledge of the wall lining thickness. It automatically adjusts to an appropriate sensitivity to locate the stud edges.

Figure 10:
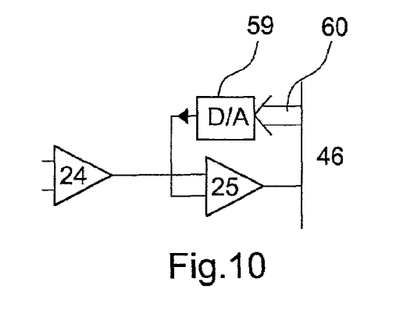
FIG. 10 illustrates an alternative method of providing a setpoint reference in the circuit of FIG. 3.

FIG. 10 illustrates an alternative method of providing a reference setpoint for the comparator 25 In the circuit of FIG. 3 the voltage divider network is replaced by a digital to analogue converter 59. The controller 46 is connected to the digital to analogue converter 59 and a controller output signal 60 is converted to an analogue voltage for the comparator 25.

A sixth embodiment also provides automatic detection of wall thickness.

Figure 12A:
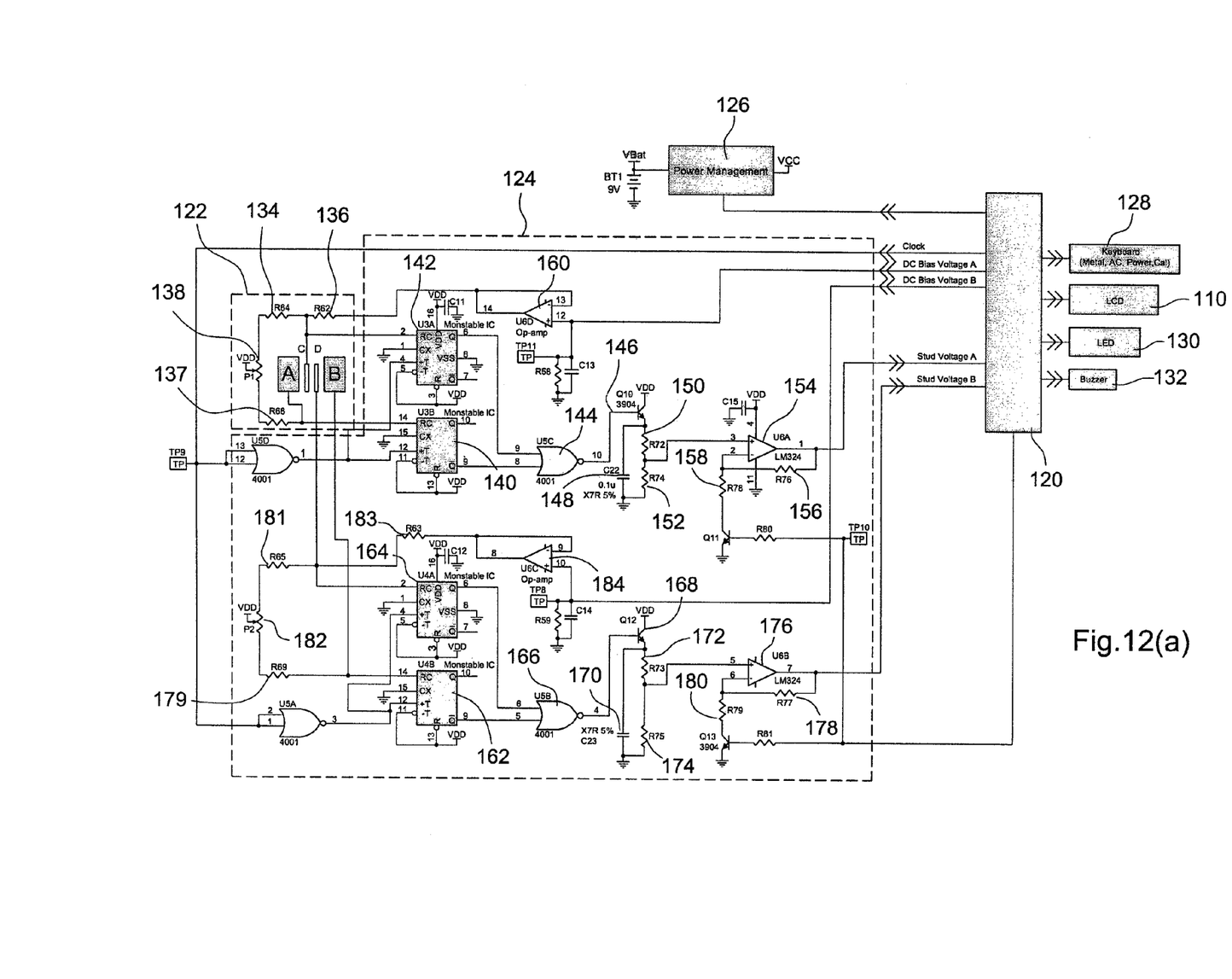
FIG. 12(a) is a circuit diagram of the control electronics for this further embodiment.

FIG. 12(*a*) illustrates the operative electronic circuitry of the stud sensing device in accordance with this embodiment. Central to the control and operation is microcontroller 120. A sensor circuit indicated 122 includes an array of capacitor pads as discussed further below. The major part of the circuit comprises detection and processing circuits 124.

A power management circuit is indicated 126. Outputs from the MCU to go to displays and other user interfaces such as keypad 128, LCD display 110, LED display 130, buzzer 132.

Figure 17:
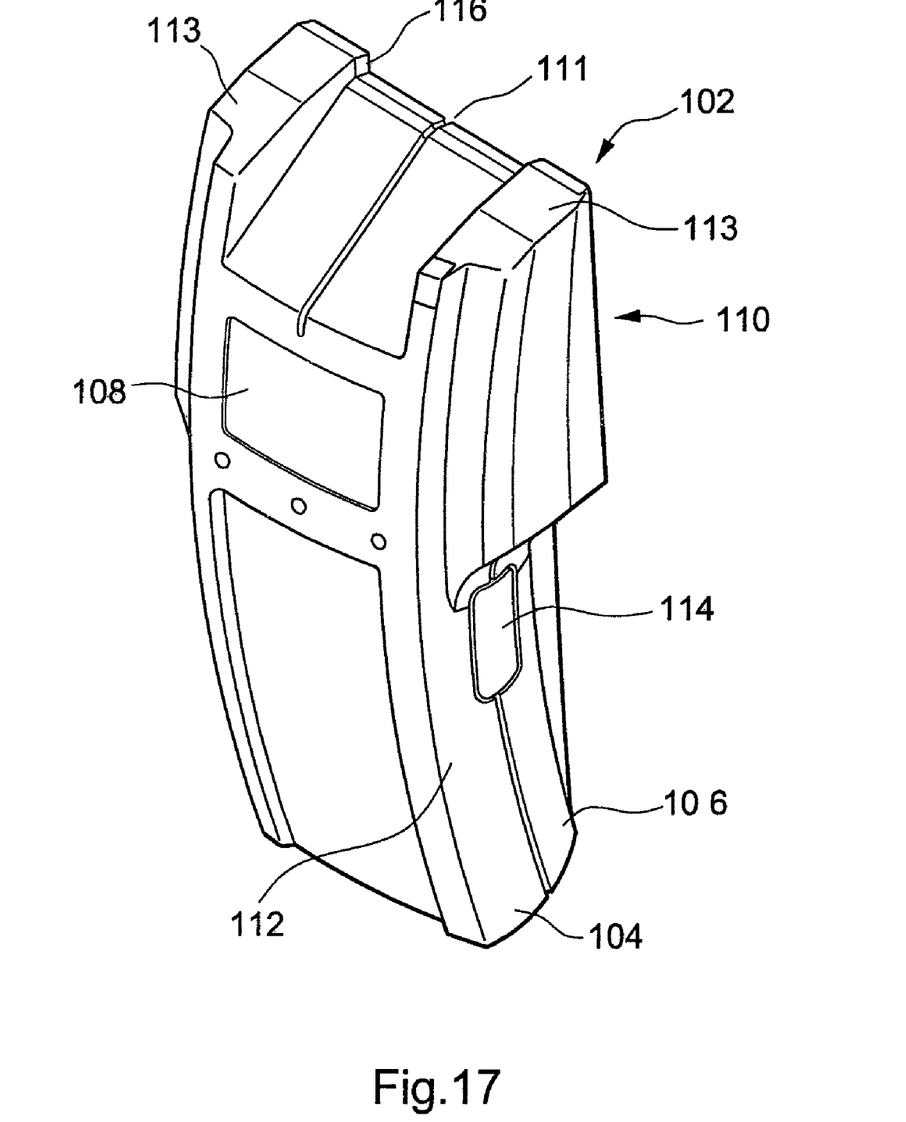
FIG. 17 is an external perspective view of an embodiment of a stud sensing device according to the invention.

FIG. 17 shows the external housing 102 formed from front and rear housing elements 104, 106. The front element 104 includes a display area 108 and the back element 106 includes a detection face 110 that is placed against a wall lining. The housing 102 also includes a grip portion 112. Proximate the grip portion 112 is an on-off push button switch 114. The housing 102 may also have a centre-line groove 111 and a pair of upstands 113 inner edges 116 of which constitute markers, spaced apart by a typical stud width of 1½ inches, in order to indicate stud edges once the centre is found.

Figure 11:
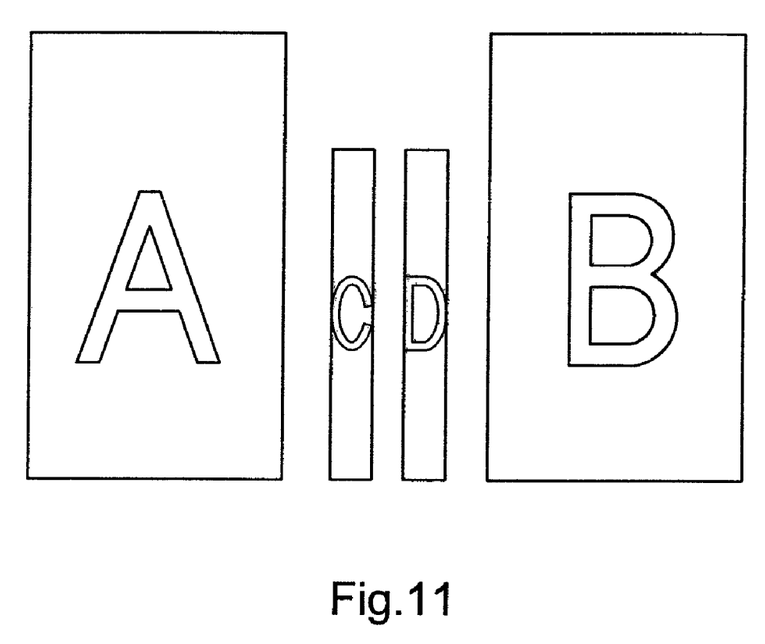
FIG. 11 illustrates the sensor pad structure of a further embodiment of a sensing device.

The core of the circuit is also based on the circuits of Applicant's U.S. Pat. No. 6,894,508 and 2005/0138886 the contents of which are incorporated herein by reference. However, instead of using a single primary sensing capacitor plate and a pair of smaller coplanar side plates the sensor circuit 122 preferably uses a pair of sensors each having a coplanar primary plate indicated A, B each with a single respective side coplanar plate C, D arranged between the primary plates A, B as shown in FIG. 11. Each sensor capacitor pair A, C and B, D have their own identical measuring circuits used to derive voltages $V_A$, $V_B$ indicative of capacitance and hence dielectric constant of adjacent wall material as discussed below.

More particularly, the first primary capacitor plate A defines a first primary capacitor whose capacitance varies with the dielectric constant of the adjacent region of wall, and the secondary capacitor plate C defines a capacitor whose capacitance likewise varies with dielectric constant of the adjacent region of wall. The plates A, C and associated resistors constitute two RC circuits connected respectively to the inputs of the first and second monostable vibrator integrated circuits 140, 142. More particularly, resistors 137 and 138 (part thereof) and plate A constitute the first RC circuit. The second is constituted by resistors 138 (part thereof) and 134 and in parallel resistor 136 and plate C. Variable resistor 138 is used to provide a balancing of RC circuits during factory calibration. The monostable vibrators 140, 142 receive the signals $Rc_a$ and $RC_c$. The respective outputs of the monostable vibrators change for a length of time determined by the time constant of the RC network at the respective input, thereby effectively converting the two RC signals into digital pulses of varying periods according to the times taken for the waveforms to reach the threshold trigger voltages of the monostable vibrators 140, 142.

Figure 13A:
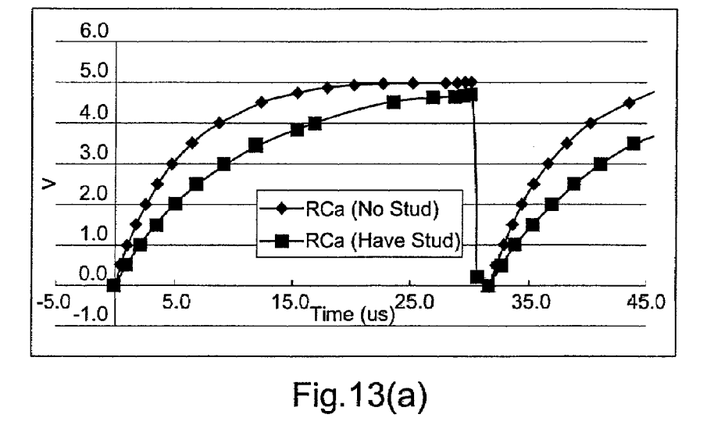
FIG. 13(a) illustrates the detected $RC_a$ waveforms for a primary sensor plate A when a stud is present and absent.
Figure 13B:
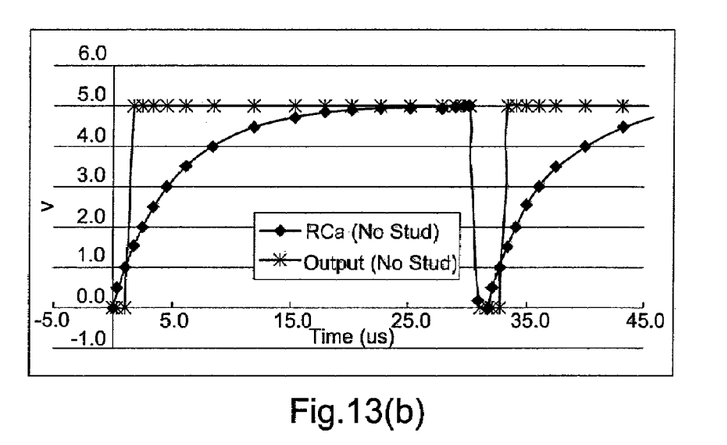
FIG. 13(b) illustrates the detected $RC_a$ waveforms for primary sensor plate A and the output from a monostable vibrator, with no stud.
Figure 13C:
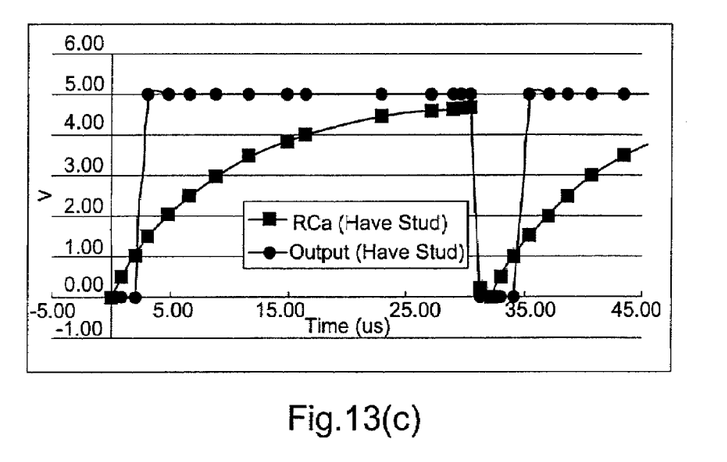
FIG. 13(c) illustrates the detected $Rc_a$ waveform for primary sensor plate A and the monostable vibrator output when a stud is present.

FIG. 13(a) shows the RC voltage response for primary plate A for a situation with no nearby stud, and secondly for a situation with nearby stud. FIG. 13(b) shows also the monostable 140 output for the no stud situation, whilst FIG. 13(c) shows the same with a nearby stud, illustrating the increased time period of each $RC_a$ cycle, and increase in the time of the low state of the digital square wave with detected stud. It will be appreciated that with a stud present both $RC_a$ and $RC_c$ outputs will have their time periods extended, but that of the main plate A, ie $Rc_a$ will be extended significantly greater than for the side plate output signal $RC_c$.

Figure 13D:
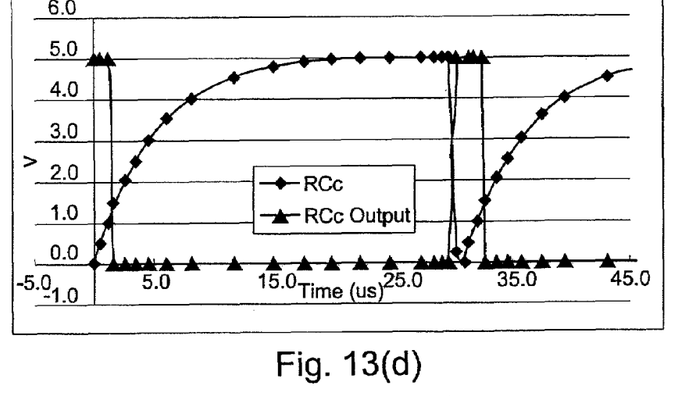
FIG. 13(d) illustrates detected $RC_a$ waveforms for secondary plate C and monostable output with no stud.

FIG. 13(d) shows the RC voltage response $RC_c$ for secondary plate C fed to monostable 142, and the inverted monostable 142 $RC_c$ output.

Figure 14A:
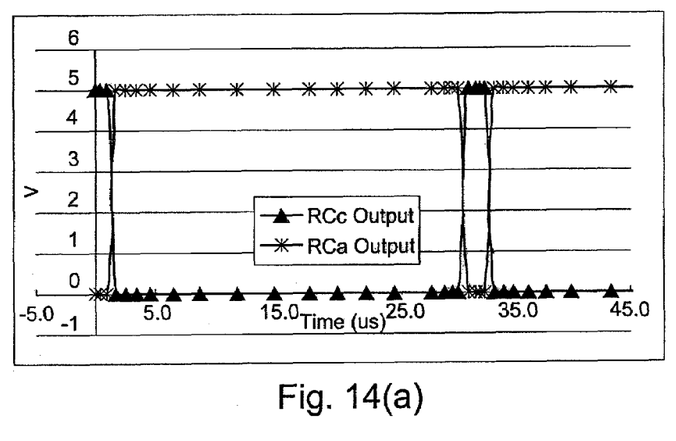
FIG. 14(a) shows the $Rc_a$ and $RC_c$ monostable outputs, for a no stud condition.
Figure 14B:
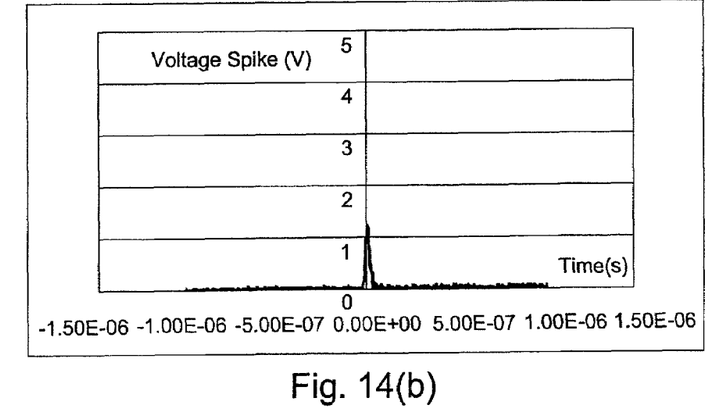
FIG. 14(b) shows the output spike from NOR gate, for no stud.

The digital output pulses of the first monostable vibrator 140 and the inverted output pulses of the second monostable vibrators 142 are fed to the inputs of the NOR gate 144. FIG. 14(b) shows these outputs $Rc_a$, $RC_c$.

Figure 14C:
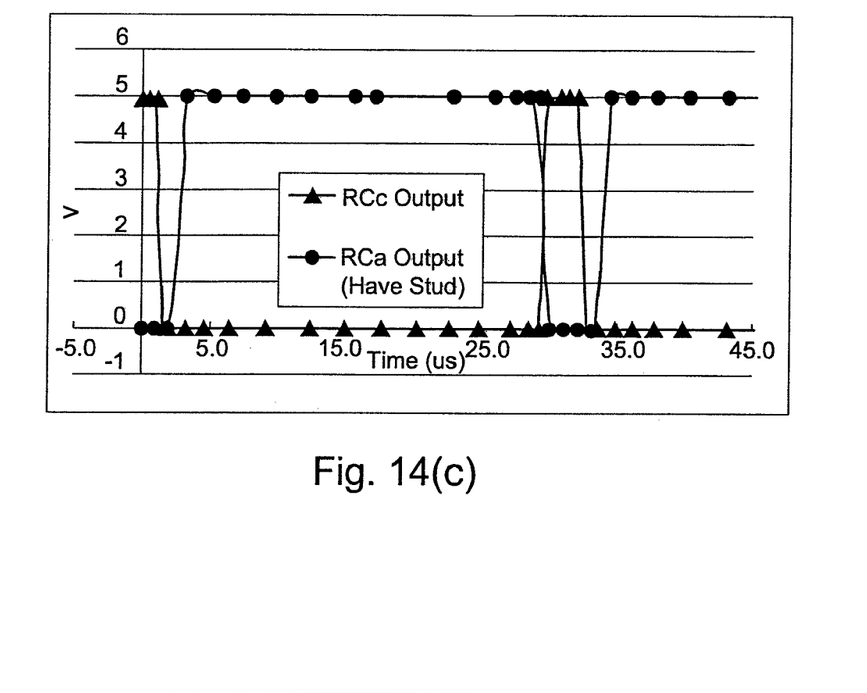
FIG. 14(c) shows the $Rc_a$ and $RC_c$ monostable outputs when a stud is present.
Figure 14D:
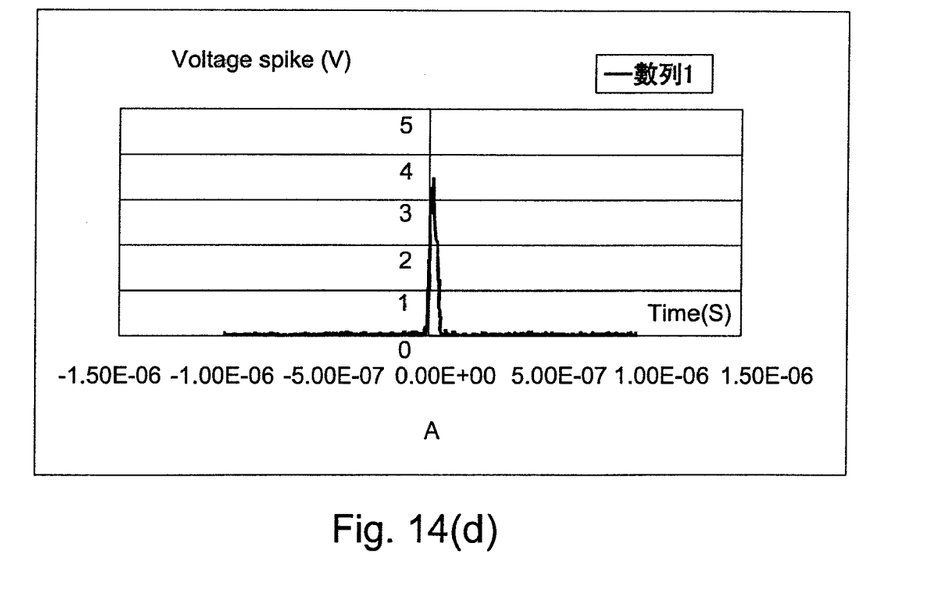
FIG. 14(d) illustrates the output spike from the FIG. 5(c) monostable outputs, ie with stud present.
Figure 15:
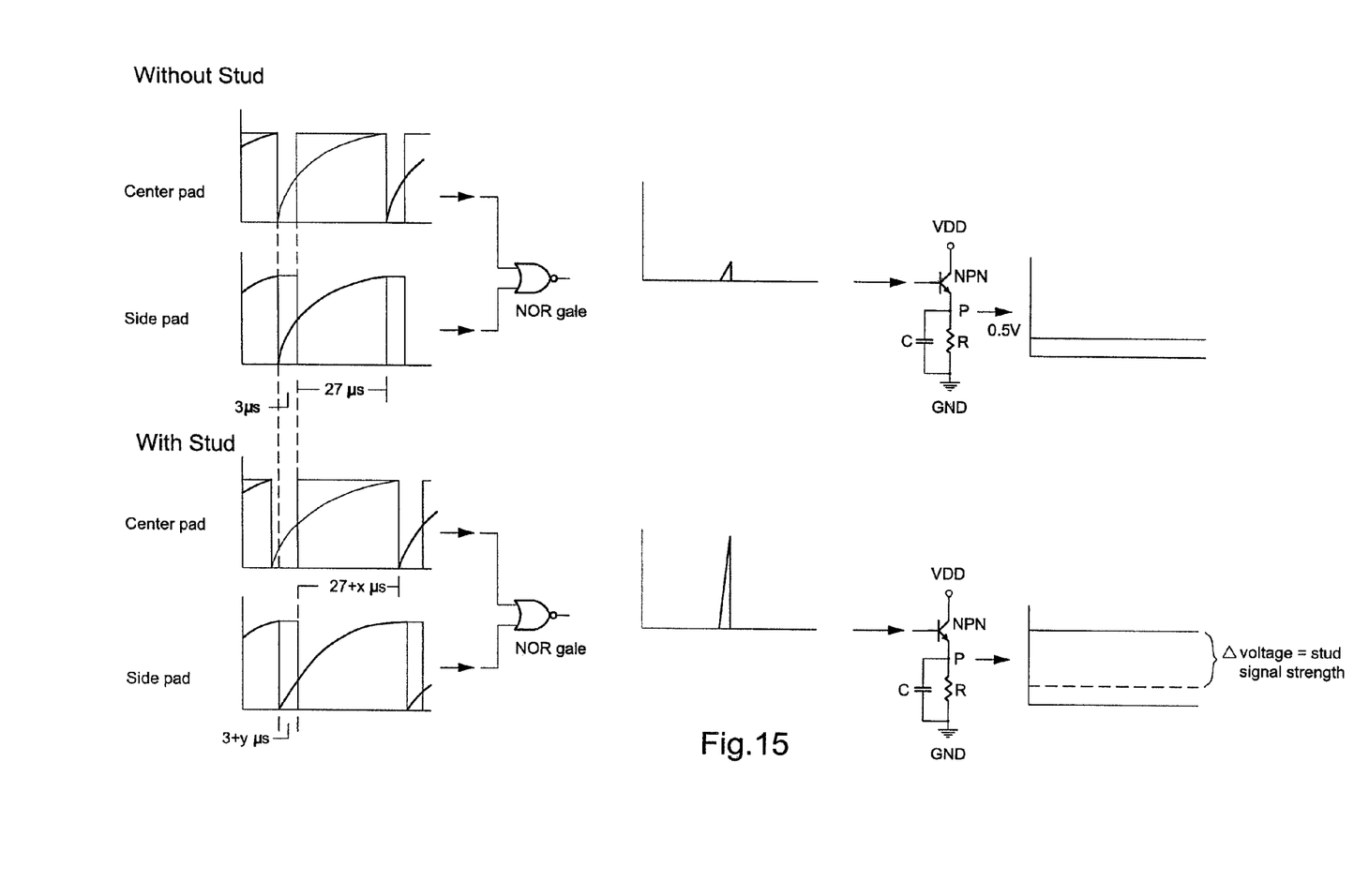
FIG. 15 illustrates schematically the derivation of output analogue signal from the pads in conditions without and with a stud.

The output of the NOR gate 144 is a voltage spike for the duration that the vibrator outputs are both below the logic switching level of the NOR gate 144, ie a voltage spike based on the timing of the overlapping regions of the two square waveforms. FIG. 14(b) shows the voltage spike in a no stud situation. FIG. 14(c) shows the square waveforms superimposed in a situation with a nearby stud, and FIG. 14(d) illustrates the resulting voltage spike. The spike amplitude is therefore dependent on the relative shift in RC time constants of the two RC circuits with the stud present, ie indicative of detected differences in dielectric constants of adjacent wall material. This is indicated also in FIG. 6. The NOR gate 144 output is fed to a rectifying circuit comprising NPN transistor 146, capacitor 148 and resistor pair 150, 152. This analogue voltage signal forms the input to operational amplifier 154 the gain of which is set by appropriate selection of resistors 156, 158. The output of operational amplifier 154 is a voltage level $V_A$ which is supplied to the MCU 120. The analogue signal derivation is also schematically illustrated in FIG. 15.

Figure 12B:
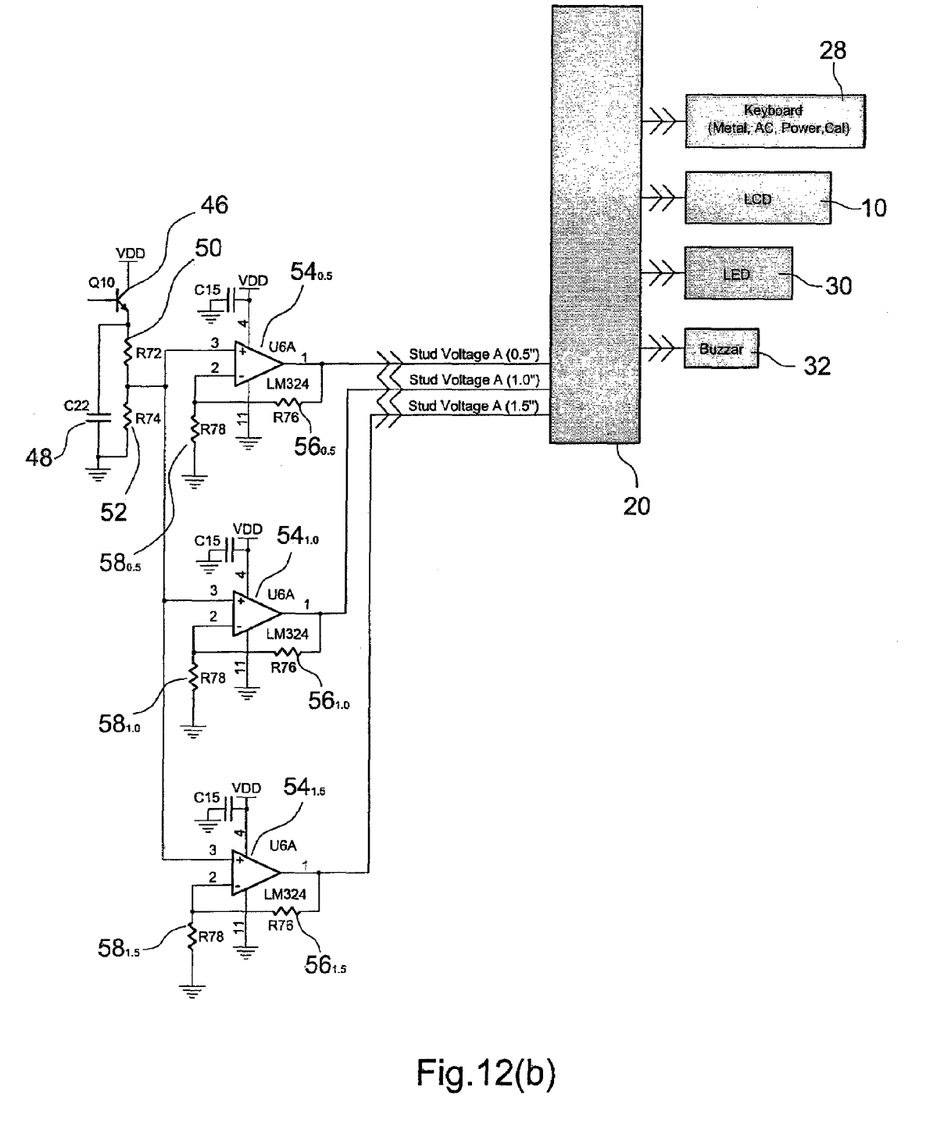
FIG. 12(b) is a circuit diagram showing an alternative amplifier arrangement providing automatic sensitivity adjust according to wall thickness.

In an alternative construction the gain of the operational amplifier 154 may be adjusted according to the wall lining conditions, most significantly its thickness. For example, it may be arranged that the user can adjust the sensitivity through user-selection of a sensitivity level, which adjusts the values of resistors 156, 158. In a further alternative illustrated in FIG. 12(b) a series of operational amplifiers are provided, indicated $154_{0.5}$, $154_{1.0}$ and $154_{1.5}$ each having associated resistors of different values controlling their gains and each providing stud voltages to the MCU 120. The amplifiers are associated with wall lining thickness of 0.5 inch, 1 inch and 1.5 inch respectively. The appropriate thickness being identifiable by the automatic depth calibration technique discussed below.

Factory calibration of the above-mentioned circuit is achieved firstly by a factory setting of variable resistor 38 within sensor circuit 122, which is able to allow for manufacturing tolerances in sensor resistors and capacitor plates A, C. The variable resistor is adjusted to match the pulses at the monostable vibrator outputs in a no-stud condition, between extreme testing conditions eg high and low humidity.

In addition, on start-up of the device in order to compensate for environmental factors such as particular characteristics of the wall lining material, temperature, humidity, interaction with the user's hand etc a self-calibration process is effected under the control of the MCU 120. MCU 120 provides a DC bias voltage via operational amplifier 160 to provide a voltage range from 0 to 5.0V with 12 bit resolution in order to maintain a predetermined voltage $V_A$ detected at the MCU 120, typically about 0.5V, the MCU 120 increasing or decreasing the amplifier bias voltage in 0.5V steps until appropriate detected voltage $V_A$ is obtained which is discernibly distant from the voltage value which may be induced by background noise (typically about 0.3V). In an alternative construction a reduced voltage range may be provided from 0 to 3.5V. In this manner it is possible to bring the effective signal out of the background "noise".

In identical manner the primary capacitance sensor pad B and secondary capacitance pad D provide RC signals $RC_b$ and $RC_d$, fed respectively to third and fourth monostable vibrators 162, 164. The primary RC circuit includes capacitor plate B and resistor 179 and part of variable resistor 182. The secondary circuit includes side capacitor plate D, and in parallel resistor 181 and part of 182, and resistor 183. The digital outputs of the monostable vibrator 164 and inverted output from monostable vibrator 164 and inverted output from monostable vibrator 162 are fed to NOR gate 166 which likewise outputs a voltage spike of magnitude dependent on variation of dielectric constant with detected stud, which is rectified via transistor 168, capacitor 170, resistance pair 172, 174 and amplified by operational amplifier 176 according to a gain controlled by resistors 178, 180. The rectified analogue output $V_B$ is fed to MCU 120. Factory calibration of the sensor is by adjustment of variable resistor 182. Calibration on switch-on is likewise effected by control of a dc bias voltage from MCU 120 via amplifier 184, in order to maintain $V_B$ of a predetermined magnitude. To shorten the calibration time prior to use the MCU 120 may control the self-calibration on both sensors and their circuits at the same time.

Although not described or illustrated the device will preferably be provided with circuits for detecting wires carrying ac current and/or metal objects as described in Applicant's U.S. Pat. No. 6,894,508 incorporated herein.

MCU 120 utilizes the two stud sensing voltages $V_A$ and $V_B$ and effects a computation of stud position in the following manner. After an initial switch-on calibration period the MCU 120 will process the $V_A$ and $V_B$ voltages. If either is greater than a predetermined background voltage level, this is indicated to a user on the LCD 110 or LED 130 display, with an indication of the direction of increasing voltage, ie whether the device should be moved to the left or right to be moved closer to the stud, and will operate the centre detection routine, establishing a difference signal $V_D=|V_A-V_B|$. This difference signal $V_D$ is continuously calculated as the sensor is moved over the wall in the vicinity of the stud, the device seeking to establish the sensor device position where $V_D$ is a minimum, indicative of the sensor being centrally over the stud. In practice, the difference $V_D$ will rarely go to zero, but a minimum threshold such as about 0.04V is utilized, $V_D \leq 0.04V$ being used to indicate a centre position. When this position is reached a visual indication is supplied to a user by the LCD 110 or LED 130 display, for example by means of a bar chart display, illumination from a light source and/or an audible indication may be supplied by buzzer 132. Alternatively, if it is known (or established) that the wall lining depth is greater than 1 inch, or larger threshold voltage may be selected, such as 0.08V.

Figure 16:
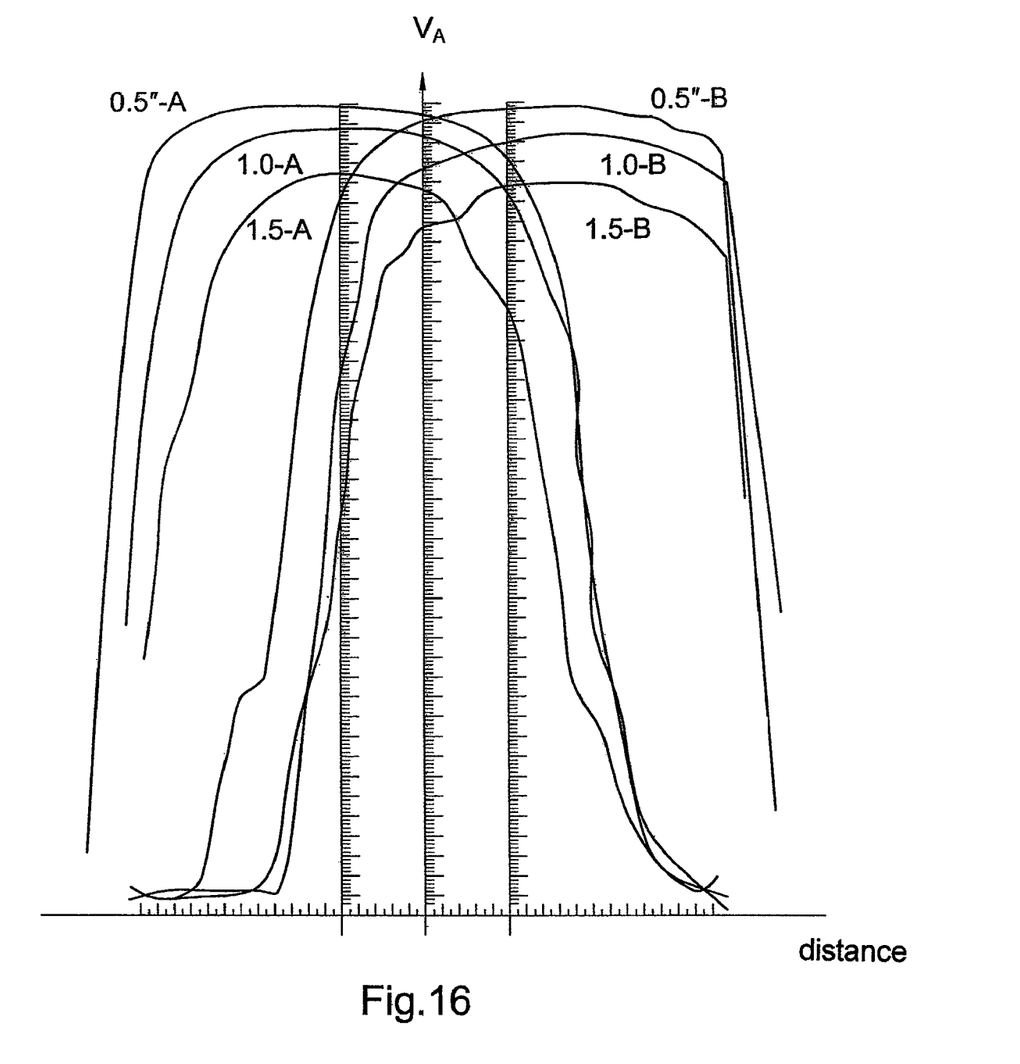
FIG. 16 shows experimental data for variation in detected voltage passing over a stud for various wall lining thicknesses.

The MCU 120 also controls an automatic depth indication and depth calibration. After switch-on calibration is complete, as the sensing device is moved over a stud (with $V_A$ and $V_B$ indicating a voltage greater than background) the MCU 120 processes the signals recording voltage maxima $V_{A\,max}$ and $V_{B\,max}$. As is well known, the voltage curve over a shallow stud has a higher maximum, and a sharper profile, whereas a deeper stud has a lower maximum and less sharp profile with more "blurred" transitions. FIG. 16 shows experimentally obtained curves where 0.5A"-A represents the variation in $V_A$ over a stud behind a 0.5 inch wall thickness, 1.0"-A the variation in $V_A$ over an 1.0 inch wall thickness lining etc. Within MCU 120 (or an associated memory) there are stored for example in a look up table or similar a pair of typical maximum threshold voltages indicated $V_{1.0}$ and $V_{1.5}$ associated with studs at depth 1 inch and 1½ inches respectively. These voltage levels are the result of prior experimentations, preferably a large number of experiments in a range of conditions, material types, humidities, with average values being taken. Typically $V_{1.0}$ is set at 3.0 volts and $V_{1.5}$ at 2.3 volts. The values of $V_{A\,max}$ and $V_{B\,max}$ are compared to $V_{1.0}$ and $V_{1.5}$. If either $V_{A\,max}$ or $V_{B\,max}$ are greater than $V_{1.0}$ and $V_{1.5}$ then the detected voltage is indicated as representing voltage with a wall thickness of ½ inch. If either $V_A$ or $V_B$ is greater than $V_{1.5}$ but less than $V_{1.0}$ this indicates a wall thickness of 1 inch. If $V_A$ or $V_B$ are lower than $V_{1.0}$ and $V_{1.5}$ the wall thickness is indicated as 1½ inches.

It will be appreciated that in the same manner a greater number of threshold voltages may be stored, with corresponding comparisons of $V_{A\,max}$ or $V_{B\,max}$ with these thresholds, for greater accuracy of depth indication.

Furthermore, the device can be further adapted to distinguish between metal studs and wood studs under a relatively thin dry wall lining of say ½ inch, by identifying a further threshold $V_{0.5}$. If either $V_{A\,max}$ or $V_{B\,max}$ are greater than $V_{0.5}$, $V_{1.0}$ and $V_{1.5}$ then the detected voltage can be indicated as representing voltage induced from an object of higher dielectric constant such as metal.

Having identified a wall thickness, this is indicated to a user on the LCD or LED displays, and/or audibly.

Moreover, having established the wall thickness, this thickness value can be utilized to improve the accuracy of edge determination, in selecting a voltage profile which corresponds to that thickness, rather than a generalized profile.

Where in the foregoing description reference has been made to integers or elements having known equivalents then such are included as if individually set forth herein.

Embodiments of the invention have been described, however it is understood that variations, improvements or modifications can take place without departure from the spirit or scope of the invention.

What is claimed is:

1. A stud sensing device for locating objects behind wall linings comprising:
    a sensor having at least first and second generally coplanar capacitor plates having capacitances dependent on adjacent material;
    a detection circuit connected to the sensor providing a detection signal voltage dependent on changes of detected capacitances;
    processing means for receiving the detection signal and identifying a maximum signal value, and for comparing the maximum signal value with stored predetermined threshold values associated with respective object depths; and
    means for indicating to a user object depth, based on the stored predetermined threshold values and the maximum signal value.

2. The device of claim 1 wherein the stored predetermined threshold values are associated with known wall thickness values.

3. The device of claim 1 wherein the stored predetermined threshold values are associated with thickness values of at least one of ½, ⅝, ¾, 1, 1½, and 2 inches.

4. The device of claim 1 wherein the stored predetermined threshold values are associated with object depths of 1 inch and 1½ inches, denoted $V_{1.0}$ and $V_{1.5}$, respectively.

5. The device of claim 4 wherein the processing means compares the maximum signal values to two of the stored predetermined threshold values to indicate the object depth as ½ inch if the maximum signal value is greater than $V_{1.0}$ and $V_{1.5}$, to indicate the object depth as 1 inch if the maximum signal value greater than $V_{1.5}$, but less than $V_{1.0}$, and to indicate the object depth as 1½ inch if the maximum signal value is less than both $V_{1.5}$ and $V_{1.0}$.

6. The device of claim 5 wherein a further stored predetermined threshold value associated with a ½ inch lining, and non-wood stud, denoted $V_{0.5}$, is stored.

7. The device according to claim 4 wherein $V_{1.0}$ is about 3 volts and $V_{1.5}$ is about 2.3 volts.

8. The device according to claim 1 wherein the stored predetermined threshold values are obtained experimentally.

9. The device of claim 1 wherein the processing means utilizes the detection signal and compares the detection signal to the stored predetermined threshold values, indicating the object depth for a stored predetermined threshold value which is closest to the detection signal.

10. The stud sensing device according to claim 1 wherein, for each sensor there are provided the capacitor plates and associated resistors forming RC circuits having time constants dependent on the adjacent wall material, the detection signals having magnitudes dependent on changes in the time constants of the RC circuits.

11. The stud sensing device according to claim 10 comprising a pair of sensors, each sensor having at least two generally coplanar capacitor plates and associated resistors connected in respective RC circuits, and detection circuits connected to each sensor, providing first and second detection signals dependent on changes of capacitance.

12. The stud sensing device according to claim 11 wherein the larger of first and second detection signals is utilized in the comparing to stored predetermined threshold values.

13. A method of detecting stud depth beneath a wall lining utilizing a stud sensing device with a sensor having generally coplanar first and second capacitor plates having capacitances dependent on adjacent material and a detection circuit providing a detection signal dependent on a change of capacitance, the method comprising:

i) moving the sensing device over the wall and repeatedly generating a detection signal;

ii) identifying a detection signal maximum;

iii) comparing the detection signal maximum to stored predetermined values associated with different stud depths; and iv) indicating to the user the stud depth identified.

14. The method according to claim 13 wherein iii) requires comparison of the detection signal maximum to a pair of stored signal values, $V_{1.0}$ and $V_{1.5}$, associated with stud depths of 1 inch and 1½ inch, respectively.

15. The method according to claim 14 wherein, if the detection signal maximum is greater than $V_{1.0}$ and $V_{1.5}$, the stud depth is indicated as ½ inch, if the detection signal maximum is between $V_{1.0}$ and $V_{1.5}$, the stud depth is indicated as 1 inch, and, if the detection maximum is less than $V_{1.5}$, the stud depth is indicated as 1½ inches.

16. The method of claim 13 utilizing a pair of sensors providing first and second detection signals dependent on changes in capacitances.

17. The method of claim 16 wherein the larger of the first and second detection signals is utilized in comparing the detection signal maximum to the stored predetermined values.

* * * * *